United States Patent [19]

Kakuta et al.

[11] Patent Number: 5,059,780
[45] Date of Patent: Oct. 22, 1991

[54] LIGHT POWER CONTROL CIRCUIT FOR A SEMICONDUCTOR LIGHT-EMITTING ELEMENT

[75] Inventors: Yoshiyuki Kakuta; Masatoshi Adachi, both of Saitama, Japan

[73] Assignee: Pioneer Electronic Corporation, Tokyo, Japan

[21] Appl. No.: 540,530

[22] Filed: Jun. 19, 1990

[30] Foreign Application Priority Data

| Sep. 7, 1989 [JP] | Japan | 1-232097 |
| Sep. 22, 1989 [JP] | Japan | 1-246902 |
| Sep. 22, 1989 [JP] | Japan | 1-246903 |

[51] Int. Cl.$^5$ .............................. G01J 1/32
[52] U.S. Cl. .......................... 250/205; 369/116
[58] Field of Search ........... 250/205; 369/122, 116, 369/44.13

[56] References Cited

U.S. PATENT DOCUMENTS

4,692,606  9/1987  Sakai et al. .................. 250/205
4,787,078  11/1988  Yokogawa .................... 369/122
4,894,525  1/1990  Kakuta ........................ 250/205

Primary Examiner—David C. Nelms
Assistant Examiner—John R. Lee
Attorney, Agent, or Firm—Perman & Green

[57] ABSTRACT

A light power control circuit by which a stable writing without any influence of a high-frequency current on writing data is enabled by performing superposition of the high-frequency signal on a drive current of a laser diode only during a reading mode, and by inhibiting the superposition of the high-frequency current during a writing mode. In a further embodiment having a construction in which a writing drive current is superposed on a reading drive signal in the form of pulses and a voltage proportional to a writing power is subtracted from an error signal in a servo system, an influences of a writing data component on the operation of the servo system is eliminated by effecting a level shift to the voltage by a predetermined level and subtracting the voltage after the level shift from the error signal.

7 Claims, 9 Drawing Sheets

LIGHT POWER CONTROL CIRCUIT FOR A SEMICONDUCTOR LIGHT-EMITTING ELEMENT

BACKGROUND OF THE INVENTION

1. Field of the Invention

The present invention relates to a light power control circuit for controlling a light power of a semiconductor light-emitting element for use in an information recording and reproducing system employing an optical disk.

2. Description of Background Information

In optical information recording/reproducing systems for disks such as direct readable (DRAW (optical direct read after write)) disks or erasable direct readable (EDRAW (erasable direct read after write)) disks, a laser diode, that is a semiconductor light-emitting element, is used as a light source of a light beam for writing data on the optical disk or reading the written data from the optical disk. In light power control circuits for a laser diode, a high frequency current having a frequency above 100 MHz is superposed on the drive current of the laser diode in order to prevent degradation of the C/N ratio of the read signal as a result of a change in the oscillation mode of the laser diode caused by a reflected light returning from the disk surface. With such a provision, the oscillation of the laser diode becomes stable against the reflected light (see Japanese Patent Publication No. 59-9086, for example).

Conventionally, the superposition of the high frequency current is performed of course in the data reading mode, and also in the data writing mode in which the laser beam is emitted at high power unless the maximum rating of the laser diode is exceeded by the superposition of the high frequency current. However, the high frequency current for the superposition is not synchronized with writing data, a cross modulation distortion is generated by the interference between the data signal and the high frequency superposing signal if the superposition is performed in the writing mode. Consequently, the writing data is recorded with its edges being periodically shifted in the time axis, causing degradation of the recording signal.

Figure 1:
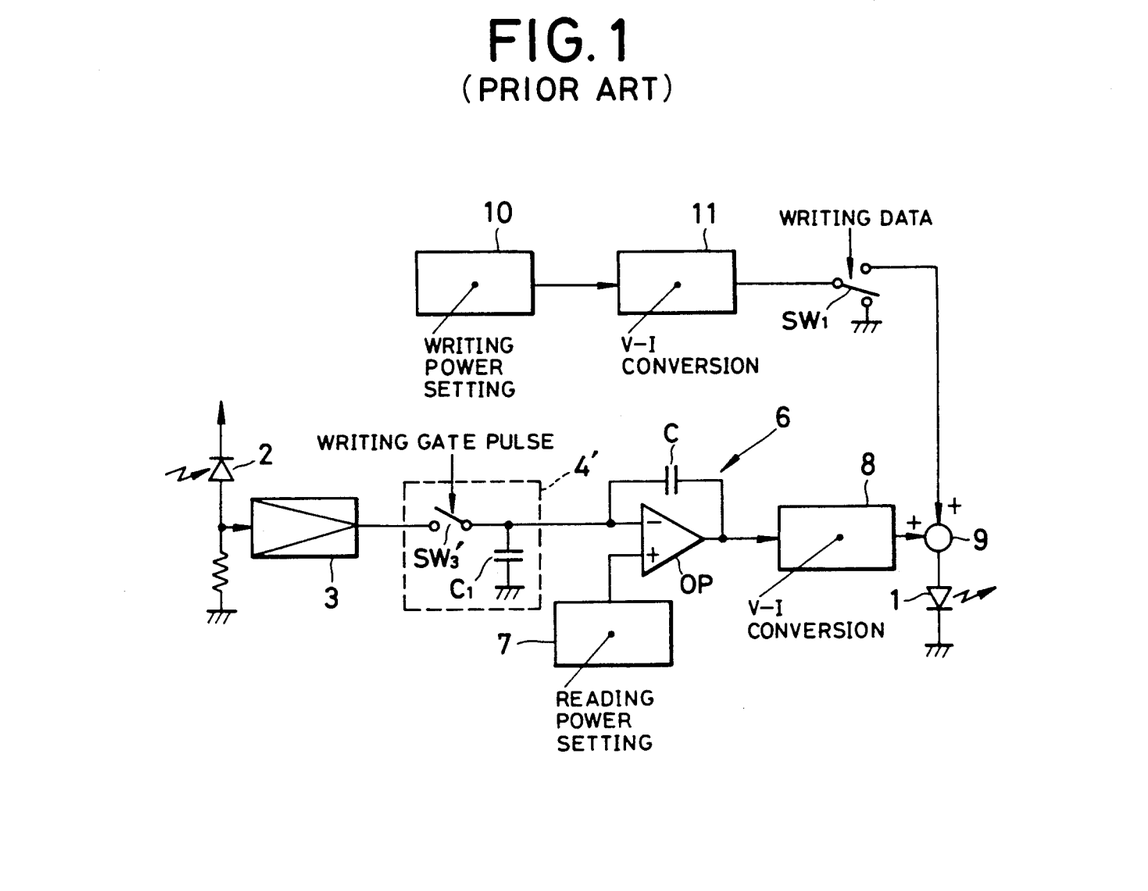
FIG. 1 is a block diagram showing an example of conventional light power control circuit.

An example of conventional light power control circuit is shown in FIG. 1. As shown, a semiconductor light-emitting element, i.e., a laser diode 1 is used as a light source for generating a writing/reading light beam for writing data and reading written data on and from a recording medium. A monitor diode 2 operating as a light sensing device is incorporated in an optical head together with the laser diode 1. The monitor diode 2 receives a part of the light emitted by the laser diode 1, and its output signal is supplied to a sample and hold circuit 4' through a monitor amplifier 3. The sample and hold circuit 4' consists of a switch $SW_3$, connected in series with an output terminal of the monitor amplifier 3, and a capacitor $C_1$ inserted between an output terminal of the switch $SW_3$, and ground. The switch $SW_3$, turns off (opens) during a writing mode and turns on (closes) during a reading mode, in response to a writing gate pulse which is generated during the period of each section of writing data and is supplied from a controller (not illustrated).

The output signal of the sample and hold circuit 4' is supplied to an inverting input terminal of an operational amplifier OP which constitutes an integrator 6 together with a capacitor C. A voltage corresponding to a reading power set value determined by the reading power setting circuit 7 is applied to a non-inverting input terminal of the operational amplifier OP. By this structure, a voltage corresponding to the difference between the output voltage of the sample and hold circuit 4' and the voltage corresponding to the reading power set value is derived. The output signal of the integrator 6 is converted to a current by means of a V-I (voltage to current) converter 8, and in turn supplied to a laser diode 1 through an adder 9 as a writing drive current.

For writing data, a greater laser power than that in the reading time is needed, and the laser power value for the writing operation is set by a writing power set circuit 10. The voltage corresponding to the set value of the writing power, which is issued from the writing power set circuit 10, is converted to a current at another V-I converter 11 and in turn supplied to a switch $SW_1$. The switch $SW_1$ is positioned on the ground side during the reading mode. During the writing mode, the switch $SW_1$ is on/off operated in response to the writing data, so that the current corresponding to the writing power set value is modulated in response to the writing data. The output current of the switch $SW_1$ is superposed on the reading drive current at the adder 9, and the obtained current is supplied to the laser diode 1 as a writing drive current.

The sample and hold type light power control circuit described above is constructed that a light power sensing voltage sensed by the monitor diode 2 in the reading time immediately before the writing mode is stored in the capacitor $C_1$ at the data writing time, and the voltage corresponding to the writing power set value is added to the hold voltage. Therefore, no problem arises if the recording format is such that the laser power returns to the reading power at predetermined intervals, such as in the data recording. However, if the recording is performed for a long time, the light power sensing voltage at the reading time cannot be maintained because of discharge of the capacitor $C_1$. In such a case, a problem arises that the mode of the operation cannot be changed immediately to the reading mode from the writing mode.

Moreover, it is also possible to use an A/D converter and a D/A converter instead of the sample and hold circuit 4'. However, even if A/D and D/A converters are used, current-light power characteristic curve will be changed if the writing time is prolonged, due to the heat generated by the laser diode 1. As a result, it is not possible to hold the light power sensing voltage sensed during the reading time, and the mode cannot be changed immediately from the writing mode to the reading mode also in this case.

Furthermore, there is a known control circuit disclosed in Japanese Patent provisional publication No. 59-146457 as another example of the light power control circuit. In the case of this control circuit an average value of the writing data is produced, and a stable operation of the system is attained by multiplying the average value to the writing power set value, then subtracting the obtained multiplied value from the light power sensing voltage generated by the light sensor. However, in such a control circuit, a problem of drift and the necessity of an off-set adjustment inevitably arise because of the use of a multiplier for multiplying the average value of writing data and the writing power set value.

OBJECTS AND SUMMARY OF THE INVENTION

An object of the present invention is to provide a light power control circuit for a semiconductor light-emitting emitting element by which the influence of the high-frequency signal to be superposed on the driving signal upon writing data is eliminated so that the writing of data is performed in a stable manner.

Another object of the present invention is to provide a light power control circuit for a semiconductor light-emitting element which can set the power of the laser beam to a reading power level without delay even if the laser beam is emitted at a writing power level for a long time, and in which the problem of drift as well as the need of the off-set adjustment is eliminated.

According to the first aspect of the present invention, there is provided a control circuit for controlling the light power of a semiconductor light-emitting element in an optical disk information recording and reproducing system, and the circuit comprises drive current supply means for supplying a drive current to the semiconductor light-emitting element, and superposing means for superposing a high-frequency signal on the drive current, wherein the superposing means inhibits the superposition of the high-frequency signal during the period of a writing mode of the recording and reproducing system.

A light power control circuit according to another aspect of the present invention is a light power control circuit for a semiconductor light-emitting element including a light sensing device for receiving a part of light rays emitted from the semiconductor light-emitting element and structured to control the light power of the semiconductor light-emitting element on the basis of a detection output of the light sensing device. The control circuit further includes means for supplying a reading drive current corresponding to a reading power set value to the semiconductor light-emitting element, means for increasing and decreasing the reading drive current in response to a variation of a detection output of the light sensing device with respect to the reading power set value, modulating means for modulating a voltage corresponding to a writing power set value by writing data, means for superposing an output current of the modulating means on the reading drive current and supplying a superposed current to the semiconductor light-emitting element, high frequency current superposing means for superposing a high frequency current on the reading drive current only during a reading mode, and correcting means for correcting the driving means during the writing mode.

According to the third aspect of the present invention, the light power control circuit for a semiconductor light-emitting element includes a light sensing device for sensing a part of light rays emitted from the semiconductor light-emitting element, and structured to control the light power of the semiconductor light-emitting element on the basis of the detection output signal of the light sensing device. The control circuit further includes means for supplying a reading drive signal corresponding to a reading power set value to the semiconductor light-emitting element, first modulating means for modulating a voltage corresponding to a writing power set value by writing data, means for superposing an output current of the first modulating means on the reading drive current and supplying a current obtained by the superposition to the semiconductor light-emitting element as a writing drive current, first averaging means for averaging the detection output signal of the light sensing device, level shifting means for shifting a signal level of the current corresponding to the writing power set value by a predetermined level, second modulating means for modulating an output signal of the level shifting means by the writing data, second averaging means for averaging a modulated output signal of the second modulating means, subtracting means for subtracting an output signal of the second averaging means from the output signal of the first averaging means, and means for performing an increasing and decreasing control of the reading drive signal in response to a variation of a subtraction output signal of the subtracting means with respect to the reading power set value.

In the light power control circuit for a semiconductor light-emitting element according to the first aspect of the present invention, the high-frequency current is superposed on the drive current of the semiconductor light-emitting element only during the reading mode, and the superposition of the high-frequency current is inhibited during the writing mode.

In the light power control circuit according to the second aspect of the present invention the high-frequency current is superposed on the drive current of the semiconductor light-emitting element only during the reading mode, and the superposition of the high-frequency current is inhibited during the period of the writing mode, and furthermore, correction of the writing drive current of the semiconductor light-emitting element is performed during the writing mode.

In the light power control circuit according to the third aspect of the present invention, a reading drive current corresponding to a reading power set value is supplied to the semiconductor light-emitting element, a voltage corresponding to a writing power set value is modulated by writing data, and the modulated output current is superposed on the reading drive signal and the current obtained by the superposition is supplied to the semiconductor light-emitting element as a writing drive current. In the writing mode, the signal level of the current corresponding to the writing power set value is shifted by a predetermined level, and the level shifted output is modulated by the writing data. An average output obtained by averaging the modulated output is subtracted from an average output obtained by averaging the detection output signal of the light sensing element, and the reading drive current is increase/decrease controlled in response to a variation component of the subtraction output with respect to the reading power set value.

DETAILED DESCRIPTION OF PREFERRED EMBODIMENTS

Figure 2:
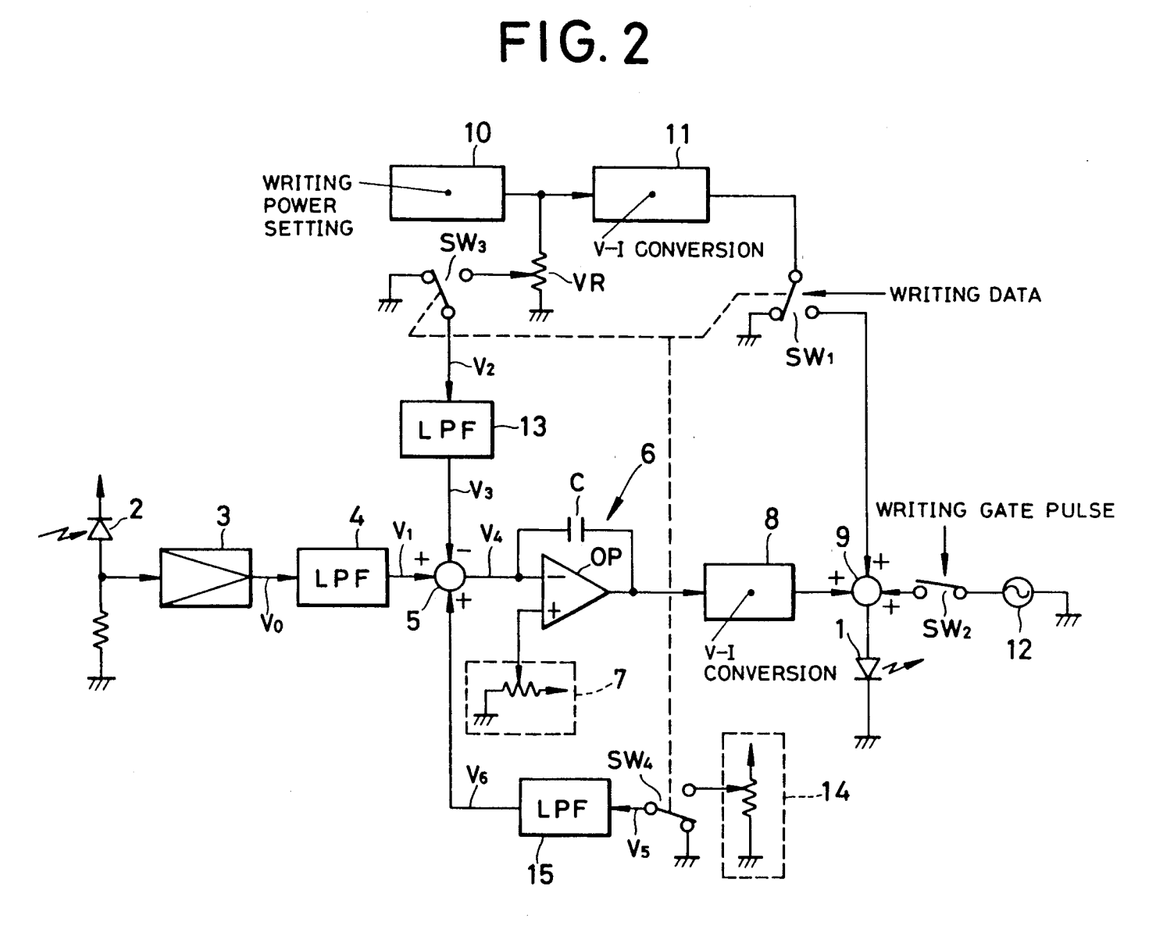
FIG. 2 is a block diagram showing an embodiment of the light power control circuit according to the present invention.

FIG. 2 is a block diagram showing an embodiment of the present invention.

As shown in the figure, a monitor diode 2 is provided for monitoring the light emitted by a laser diode 1, and a light power detection voltage issued from the monitor diode 2 is supplied to an LPF (Low Pass Filter) 4 operating as a first averaging means through a monitor amplifier 3. A voltage $V_1$ generated by the averaging operation in the LPF 4 is supplied to an adding input terminal of an adder-subtractor (adding and subtracting circuit) 5. An output signal of the addersubtractor 5 is supplied to an inverting input terminal of an operational amplifier OP which constitutes an integrator 6 together with a capacitor C. A voltage corresponding to a reading power set value generated by a reading power setting circuit 7 is supplied to the noninverting input terminal of the operational amplifier OP. An output voltage of this integrator 6 is converted to a current by a V-I (voltage to current) converter 8, and supplied to the laser diode 1 through an adder 9.

Since a higher laser power is needed for writing data as compared with the reading time, a laser power value for writing is set at a writing power setting circuit 20. A voltage corresponding to the writing power setting value is issued from the writing power setting circuit 10, and is converted to a current at a V-I converter 11. This current is supplied to a switch $SW_1$ provided as a first modulating means. The switch $SW_1$ is positioned to ground during a reading mode. During the writing mode, on/off operations are repeated in response to writing data, so that the current corresponding to the writing power set value is modulated by the writing data. An output current of the switch $SW_1$ is superposed on the reading drive current at the adder 9, and supplied to the laser diode 1 as a writing drive current.

In addition, a high-frequency current having a frequency higher than 100 MHz generated by a high-frequency oscillator 12 is supplied to the adder 9 via a switch $SW_2$. The switch $SW_2$ is normally positioned at an on (closed) position, and turns off (opens) in response to a writing gate pulse which is generated by a controller during a writing data period. By this provision, the superposition of the high-frequency signal on the writing drive signal of the laser diode 1 is inhibited, so that the high-frequency signal is superposed on the reading drive signal of the laser diode 1 only during the reading mode.

The voltage corresponding to the writing power set value issued from the writing power setting circuit 10 is supplied, through a variable resistor $V_R$, to a switch $SW_3$ provided as a second modulating means. The switch $SW_3$ is interlocked with the switch $SW_1$, and switched to ground during the reading mode. During the writing mode, the output voltage of the variable resistor $V_R$ is on/off controlled in response to the writing data thereby the output voltage is modulated, and further supplied to an LPF 13 having the same time constant as the LPF 4, provided as second averaging means. A voltage $V_3$ generated by averaging at the LPF 13 is supplied to a subtracting input terminal of the adder-subtractor 5.

The apparatus is further provided with a correction voltage setting circuit 14 for setting a correction voltage relating the superposition of the high-frequency signal. The correction voltage issued from this correction voltage setting circuit 14 is supplied to a switch $SW_4$ provided as a third modulating means. The switch $SW_4$ is interlocked with the switches $SW_1$ and $SW_3$, and switched to ground during the reading mode. During the writing mode, the correction voltage is modulated by the on/off control, and supplied to an LPF 15 having a time constant the same as that of the LPFs 13 and 14. A voltage $V_6$ generated by the averaging process in the LPF 15 is supplied to the adding input terminal of the addersubtractor 5. The summing-subtracting output $(V_1 - V_3 + V_6)$ of the adder-subtractor 5 is supplied to the integrator 6 in which a variation component with respect to the voltage corresponding to the reading power set value is derived. In the figure, the switches $SW_1$ trough $SW_4$ are shown as mechanical switches for the purpose of explanation. However, it is needless to mention that these switches can be constituted by known electronic switches. Furthermore, the time constants of the LPFs 4, 13, 15 are determined to be sufficiently lower than a response time constant of an APC (automatic power control) servo system.

The operation of the circuit having a structure described above will be explained with reference to the waveform diagrams shown in FIGS. 3A through 3D.

In this circuit, change-over between the reading and writing modes is performed by means of the writing data being supplied. Specifically, the data section of the writing data (a) corresponds to the period of the writing mode, and other sections correspond to the period of the reading mode.

Operations of the circuit when the superposition of the high-frequency current on the drive current of the laser diode 1 is not considered will be explained at first. It is assumed that there is no adding input to the adder-subtractor 15 from the LPF 15 in this state.

In the reading mode, both of the switches $SW_1$ and $SW_3$ are switched to ground, and a reading drive current corresponding to a reading power set value which is determined by the reading power setting circuit 7 is supplied to the laser diode 1. In this state, the light power detection voltage detected by means of the monitor diode 2 is averaged by the LPF 4 after passing through a monitor amplifier 3, and in turn supplied to the addersubtractor 5. The light power detection voltage $V_0$ (b) which is the output signal of the monitor amplifier 3 is a substantially constant voltage $V_{OR}$ during the reading operation. On the other hand, the average voltage $V_3$ by the LPF 13 is also equal to zero because the output voltage $V_2$ (c) is equal to zero. Therefore, the voltage value $V_{OR}$ directly forms an output voltage $V_4$ (d) of the adder-subtractor 5. In addition, an increase-decrease control of the reading drive current (referred to as APC servo, hereinafter) is performed in response to the amount of variation of the output voltage $V_4$ (d) with respect to the voltage corresponding to the reading-power set value. By this operation, the light power of the laser diode 1 is maintained constant.

Figure 3A:
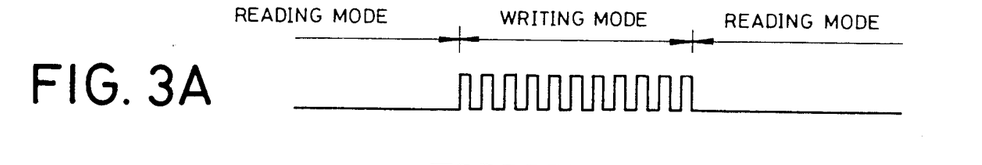
FIGS. 3A through 3D are waveform diagrams for explaining circuit operations without the superposition of a high-frequency current.
Figure 3B:
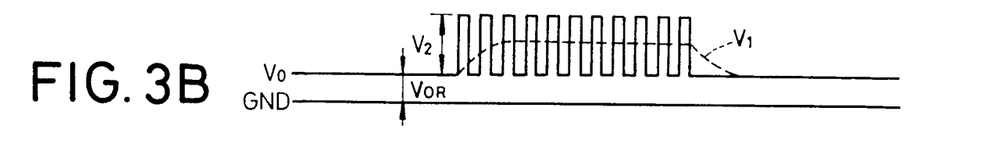
Figure 3C:
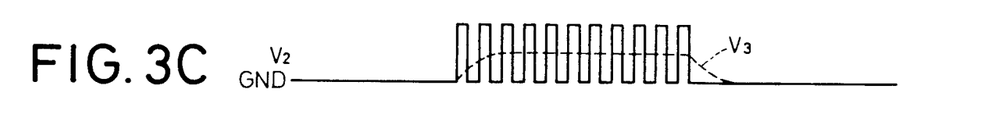
Figure 3D:
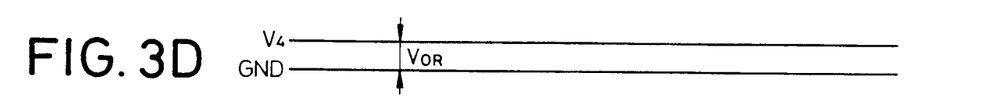

In the writing mode, when the switches $SW_1$ and $SW_3$ are on/off controlled in response to the writing data (a), a pulse-shape voltage obtained by the superposition of the pulse waveform for the writing mode on the constant voltage $V_{OR}$ for the reading mode is produced as an output voltage $V_0$ (b) of the monitor amplifier 3. Since this pulse-shape voltage $V_0$ passes through the LPF 4, an average voltage as indicated by the dashed line in FIG. 3B is obtained as an output voltage $V_1$ of the LPF 4. On the other hand, as an output voltage $V_2$ (c) of the switch $SW_3$, a pulse-shape voltage is generated by the on/off control of the voltage corresponding to the writing power set value in response to the writing data (a), and supplied to the LPF 13. When the pulse-shape signal $V_2$ passes through the LPF 13, an average voltage as indicated by the dashed line in FIG. 3C is obtained as an output voltage $V_3$ of the LPF 13. By subtracting the average voltage $V_3$ from the average voltage $V_1$ mentioned above, the constant voltage $V_{OR}$ for the reading mode is obtained as the output voltage $V_4$ (d) of the addersubtractor 5. Therefore, the output voltage $V_4$ (d) will be maintained constant through the writing mode and the reading mode. It is needless to mention that, also in the writing mode, the increasing-decreasing control of the reading drive signal is performed in response to the amount of variation of the output voltage $V_4$ (d) of the adder-subtractor 5 with respect to the reading power set value.

Thus, the voltage corresponding to the writing power set value is modulated in response to the writing data (a) and treated by the averaging process subsequently, and the average voltage $V_3$ is subtracted from the average voltage $V_1$ of the light power detection voltage $V_0$. Therefore, the constant voltage $V_{OR}$ which is constant for the reading and writing modes is obtained as the subtracted voltage $V_4$, which in turn allows a quick change-over from the reading mode to the writing mode, and vice versa. Furthermore, even if the light-emitting element is operated to emit the writing power for a long time, the power level can be returned to the reading power quickly.

Then, the operation of the circuit will be further explained for the case where the high-frequency current is superposed on the drive current of the laser diode in the reading mode, and the superposition of the high-frequency current is not performed during the writing mode.

Since the switch $SW_2$ is operated to the on (closed) state during the reading mode, the high-frequency current having a frequency above 100 MHz from the high-frequency oscillator 12 is supplied to the adder 9 through the switch $SW_2$, so that the high-frequency current is superposed on the reading drive current of the laser diode 1. By the superposition of the high-frequency current on the drive current of the laser diode 1, the oscillation of the laser diode can be performed in a stable manner although there is a reflection light returning from the disc.

Figure 4:
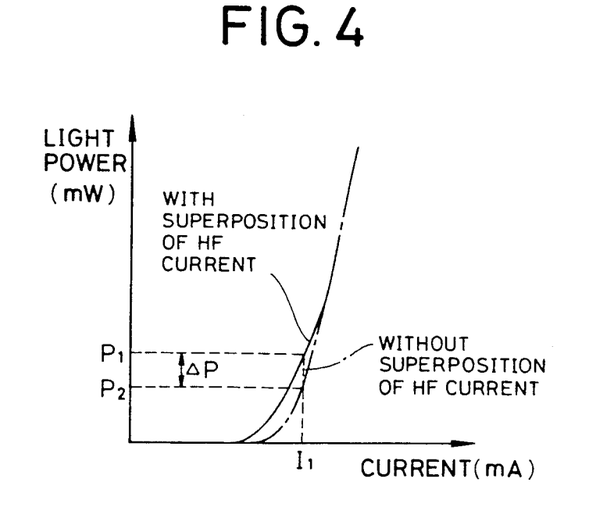
FIG. 4 is a diagram showing a current versus light power characteristic of the laser diode.
Figure 5A:
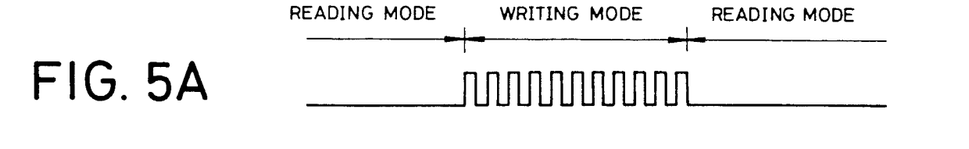
FIGS. 5A through 5E are waveform diagrams showing circuit operations with the superposition of the high-frequency current.
Figure 5B:
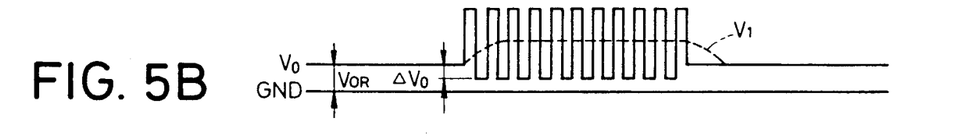
Figure 5C:
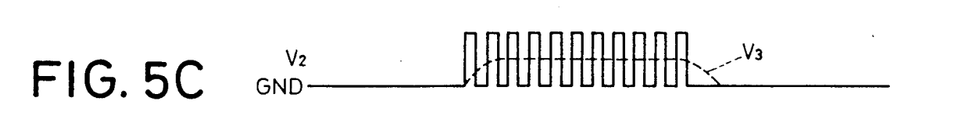

On the other hand, in the writing mode, the switch $SW_2$ is operated to the off (opened) position by the application of the writing gate pulse, so that the superposition of the high-frequency current on the writing drive signal of the laser diode 1 is inhibited. As shown in FIG. 4, the light power of the laser diode changes by an amount of $\Delta P$ between times where the superposition of the high-frequency current is performed ($P_1$) and not performed ($P_2$), respectively. Therefore, the bottom level of the light power during the writing becomes lower than the reading power by the amount of $\Delta P$ when the operation is changed from the reading mode to the writing mode. As a result, the light power detection voltage $V_0$ which is produced by the monitor amplifier 3 drops by an amount $\Delta V_0$ which corresponds to $\Delta P$, as shown in FIG. 5B. At this time, the APC servo is operated to follow the change, so that the reduced component $\Delta V_0$ is compensated, and the follow-up completes within the servo band.

In other words, the constant reading power and the constant writing power cannot be obtained by simply on/off controlling the superposition of the high frequency signal when the mode of operation is changed from the reading mode to the writing mode, or vice versa. More specifically, this is because a variation of $\Delta V_0/2$ is added to the output voltage $V_4$ of the adder-subtractor 5 by the turning-off of the high-frequency signal upon the shift to the writing mode.

Figure 5D:
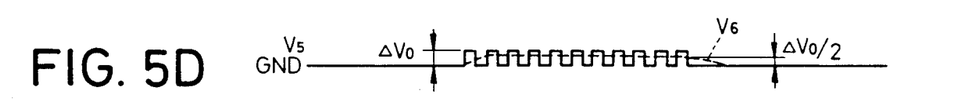
Figure 5E:
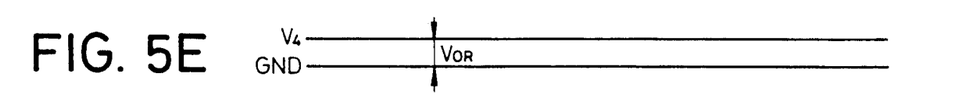

In order to compensate the variation component $\Delta V_0/2$, a voltage $V_5$ having an amplitude $\Delta V_0$ indicated by the solid line in FIG. 5D is obtained by on/off controlling the correction voltage, which is set by the correction voltage setting circuit 14, by the switch $SW_4$ in response to the writing data. This voltage $V_5$ is averaged by the LPF 15, to form a voltage $V_6$ having an amplitude of $\Delta V_0/2$ is supplied to the adder-subtractor 5 as an adding input signal. By this feature, even if the variation of $\Delta V_0/2$ is generated in the output signal of $V_4$ of the adder-subtractor 5 by the on/off control of the superposition of the high-frequency signal upon the mode change between the reading and writing modes, such a variation is automatically compensated. Thus, always a constant voltage $V_{OR}$ is obtained as the output voltage $V_4$ (e) of the adder-subtractor 5, so that the APC servo is always maintained at a state in which the servo control of the reading power is effected.

As described above, the superposition of the high-frequency signal is performed in the data reading mode, and the superposition is inhibited during the writing mode. By this feature, the oscillation condition of the laser diode 1 against the returning light is maintained to be stable during the reading mode. During the writing mode, on the other hand, the writing is performed in a stable manner while the recording data is not affected by the high-frequency signal. Furthermore, in the writing mode, further to the provision of inhibiting the superposition of the high-frequency signal, the correction voltage $V_6$ having an amount corresponding the drop of the light power is added on the error signal $(V_1 - V_3)$ of the APC servo, so that the fluctuation of the error signal is eliminated to realize a stable operation of the APC servo.

As specifically described in the foregoing, in the light power control circuit of a semiconductor light-emitting element according to the present invention, the high-frequency signal is superposed on the drive current of the semiconductor light-emitting element only during the reading mode of the system, and the superposition of the high-frequency signal is inhibited during the writing mode. With this construction, the oscillation condition of the laser diode against the returning light is maintained to be stable during the reading mode, and writing operation is performed in a stable manner by eliminating the influence of the high-frequency signal on the writing data during the writing mode.

Referring to FIGS. 6 to 8D, the second embodiment of the present invention will be explained.

Figure 6:
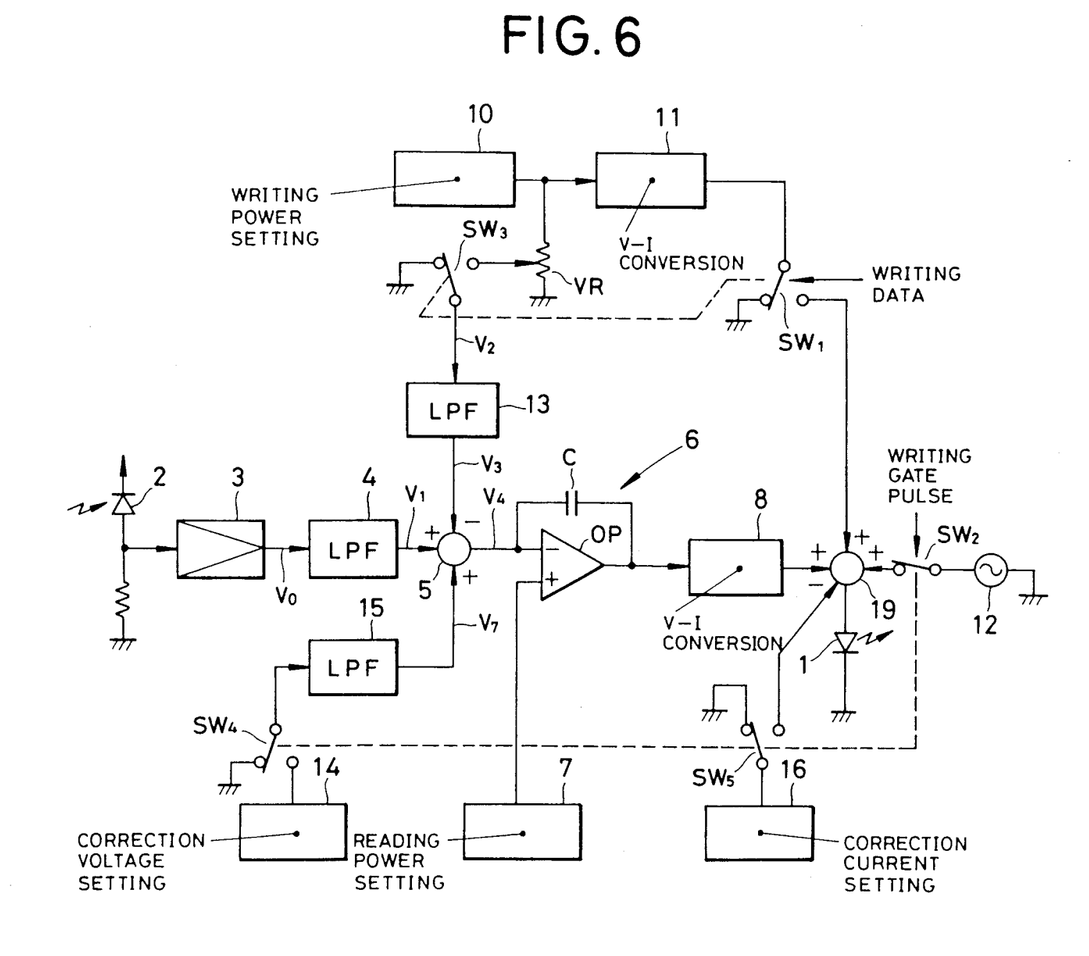
FIG. 6 is a block diagram showing another embodiment of the present invention.

With respect to the circuit construction shown in FIG. 6, the explanation of circuit elements the same as those of the embodiment shown in FIG. 2 will not be repeated. As shown, an adder-subtractor 19 is provided instead of the adder 9.

A correction current setting circuit 16 for setting a correction current relating to the superposition of the high-frequency current is provided, and the correction current set by the circuit 16 is selectively supplied to a subtracting input terminal of the adder-subtractor 19 through a switch $SW_5$. The switch $SW_5$ is interlocked with the switch $SW_2$, and normally positioned on ground side. When the writing gate pulse is supplied, the switch $SW_5$ selects the correction current set at the correction current setting circuit 16. In other words, the correction current is drawn from the writing drive current during the writing mode.

Furthermore, a correction voltage setting circuit 14 is provided for generating a correction voltage $V_7$. The correction voltage $V_7$ is used to compensate an amount of drop of the light power when a bottom power of the writing power is reduced during the writing mode, as will be explained later. The correction voltage set at the correction voltage setting circuit 14 is supplied to a switch $SW_4$. The switch $SW_4$ is interlocked with the switches $SW_2$ and $SW_5$, and normally positioned on the ground side. The switch $SW_4$ selects the correction voltage upon application of the writing gate pulse. The selected correction voltage is supplied to the adding input terminal of the adder 5 through the LPF 15 which has the constant time constant as the LPFs 4 and 13. The addition-subtraction output signal of the addersubtractor 5 $(V_1 - V_3 + V_7)$ is supplied to the integrator 6 in which a variation with respect to the voltage corresponding to the reading power set value is derived.

Then, the operation of this embodiment will be explained for the case where the high-frequency current is superposed on the drive current of the laser diode in the reading mode, and the superposition of the high-frequency current is not performed during the writing mode.

Since the switch $SW_2$ is operated to the on (closed) state during the reading mode, the high-frequency current having the frequency above 100 MHz from the high-frequency oscillator 12 is supplied to the adder 19 through the switch $SW_2$, so that the high-frequency current is superposed on the reading drive current of the laser diode 1. By the superposition of the high-frequency current on the drive current of the laser diode 1, the oscillation of the laser diode can be performed in a stable manner although there is a reflection light returning from the disc.

Figure 7:
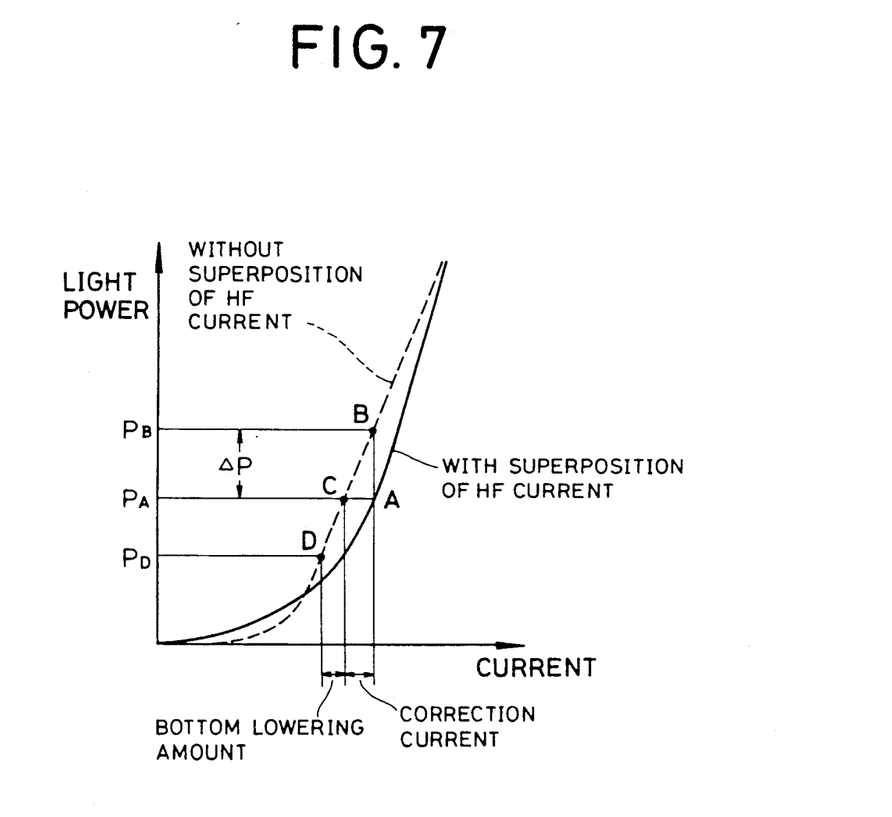
FIG. 7 is a diagram showing a current versus light power characteristic of the laser diode.
Figure 8A:
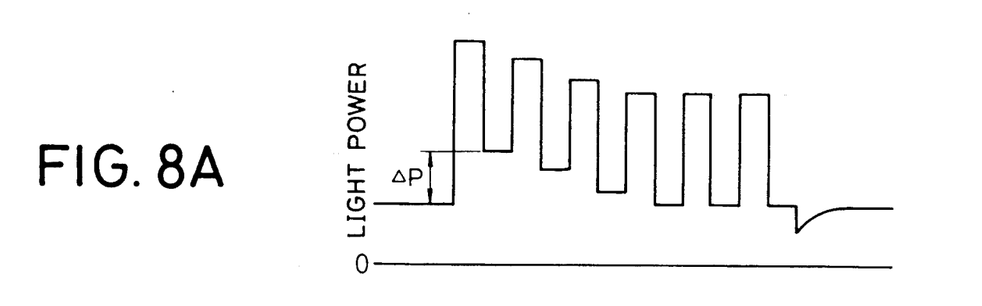
FIGS. 8A through 8D are waveform diagrams for explaining circuit operations with the superposition of the high-frequency current.

On the other hand, in the writing mode, the switch $SW_2$ is operated to the off (opened) position by the application of the writing gate pulse, so that the superposition of the high-frequency current on the writing drive signal of the laser diode is inhibited. As shown in FIG. 7, the light power of the laser diode changes by an amount of $\Delta P$ between times where the superposition of the high-frequency current is performed ($P_A$) and not performed ($P_B$), respectively. Therefore, the bottom level of the light power during the writing operation becomes higher than the power during the reading operation by the amount of $\Delta P$ when the operation is changed from the reading mode to the writing mode as indicated in FIG. 8A. As a result, the light power detection voltage $V_0$ which is produced by the monitor amplifier 3 increases by an amount $\Delta V_0$ which corresponds to $\Delta P$. At this time, the APC servo is operated to follow the change, so that the reduced component $\Delta V_0$ is compensated, and the follow-up completes within the servo band.

In other words, it takes time before a constant reading power or the constant writing power is obtained by simply on/off controlling the superposition of the high frequency signal when the mode of operation is changed from the reading mode to the writing mode, or vice versa.

Figure 8B:
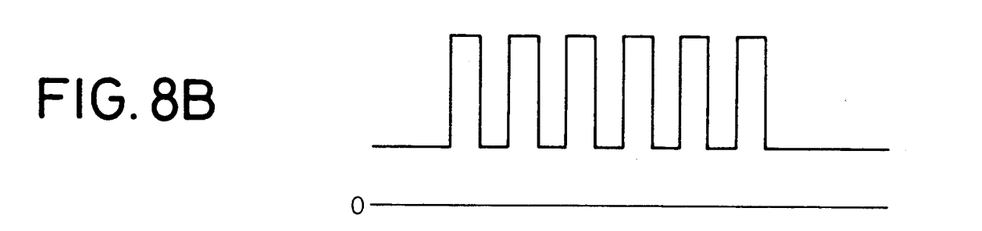

In order to alleviate the variation of the light power due to the on/off operation of the superposition of the high-frequency current, the superposition of the high-frequency current is inhibited upon transition from the reading mode to the writing mode, and the correction current set at the correction current setting circuit 15 is drawn from the writing drive current according to the present invention. As shown in the current-light power characteristic of FIG. 7, by setting the value of the correction current to be equal to a current value corresponding to a line between points A and C, the light power will not change and only the operating point moves from A to C (A→C), as shown in FIG. 8B.

In this way, the superposition of the high-frequency current is performed during the data reading mode, and the superposition is inhibited during the writing mode. By this feature, the state of oscillation of the laser diode 1 is maintained to be stable against the returning light during the reading mode, and the influence of the high-frequency signal on the recording data is eliminated during the writing mode thereby the writing is performed in a stable manner. Furthermore, during the writing mode, the superposition of the high-frequency current is inhibited and the correction current is drawn from the writing drive current. Thus, variations of the light power of the laser diode 1 is surely prevented.

On the other hand, the reading power is determined, in usual cases, at a relatively large value within a range in which no thermal change of the optical disk occurs in view of the relation between the reading power and the noise figure. If we assume that the bottom power for the writing operation is identical with the reading power, a local high-temperature region due to the peak power of writing will be generated on the disk as soon as the writing starts. At this time, heat from the high-temperature parts propagates to portions corresponding to the troughs of the writing pulse train, i.e., portions on which the light beam is irradiated at the bottom power, so that the temperature at these portions becomes higher than the normal temperature of the disk surface during the reading operation. As a result, there is a possibility that the writing state is reached in portions where the writing is not intended. This phenomenon leads to an adverse effect such that corresponding pulse edges becomes blunt.

Figure 8C:
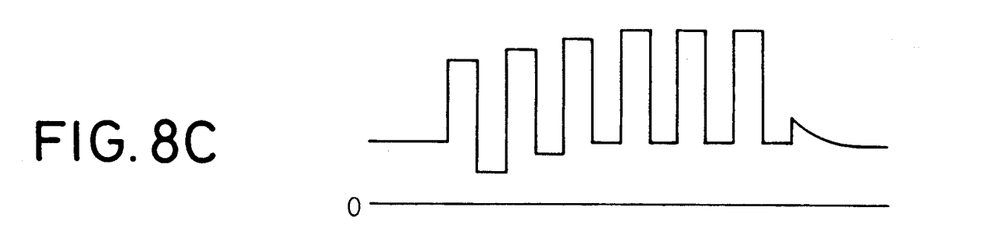
Figure 8D:
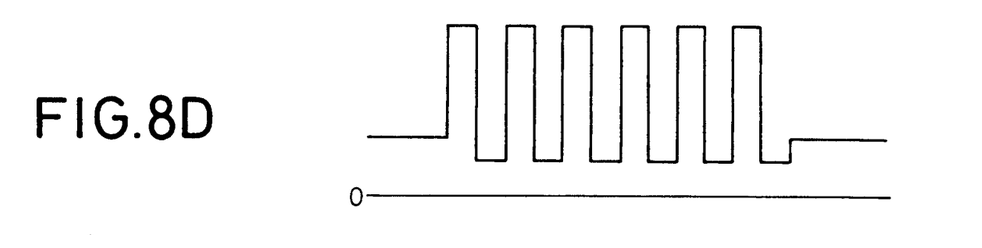

Therefore, in this embodiment, when the correction current is drawn from the writing drive current, a current corresponding to the reduction of the bottom power, in addition to the correction current, is drawn from the writing drive current. By this feature the operating point moves to the point D and the light power drops to a level $P_D$. As shown in FIG. 8D, the bottom power during the writing operation can be thus reduced to be lower than the power during the reading operation. As a result, the amount of the change in the writing power is increased so that the edges corresponding to the writing data are made clear. In this case, if a current corresponding to the reduction of the bottom power is drawn from the writing drive current, the light power detection voltage $V_0$ will also reduce by a corresponding amount, and the APC servo will operate to follow the change, to compensate the amount of reduction. Therefore, as shown in FIG. 8C, the light power will change with the time constant of the APC servo. In order to prevent this problem, the correction voltage $V_7$ having a level compensating the reduction of the light power of the laser diode 1 by the drawing of the current for the reduction of bottom power is added to the error signal $(V_1-V_3)$ of the APC servo. By this provision, the stability of the APC servo is maintained, and the bottom power can be made lower than the reading power throughout the period of the writing mode.

As specifically described in the foregoing, the second embodiment of the light power control circuit for a semiconductor light-emitting element according to the present invention is constructed that the high-frequency current is superposed on the driving current of the semiconductor light-emitting element only during the reading mode, and the superposition of the high-frequency current is inhibited and the writing drive current of the semiconductor light-emitting element is corrected during the writing mode. Therefore, the circuit can maintain the stability of the oscillation state of the semiconductor light-emitting element against the returning light is maintained during the reading mode, while the writing is performed in a stable manner by eliminating influences of the high-frequency current on the writing data during the writing mode.

The third embodiment of the present invention will be explained with reference to FIGS. 9 through 11 of the accompanying drawings.

Figure 9:
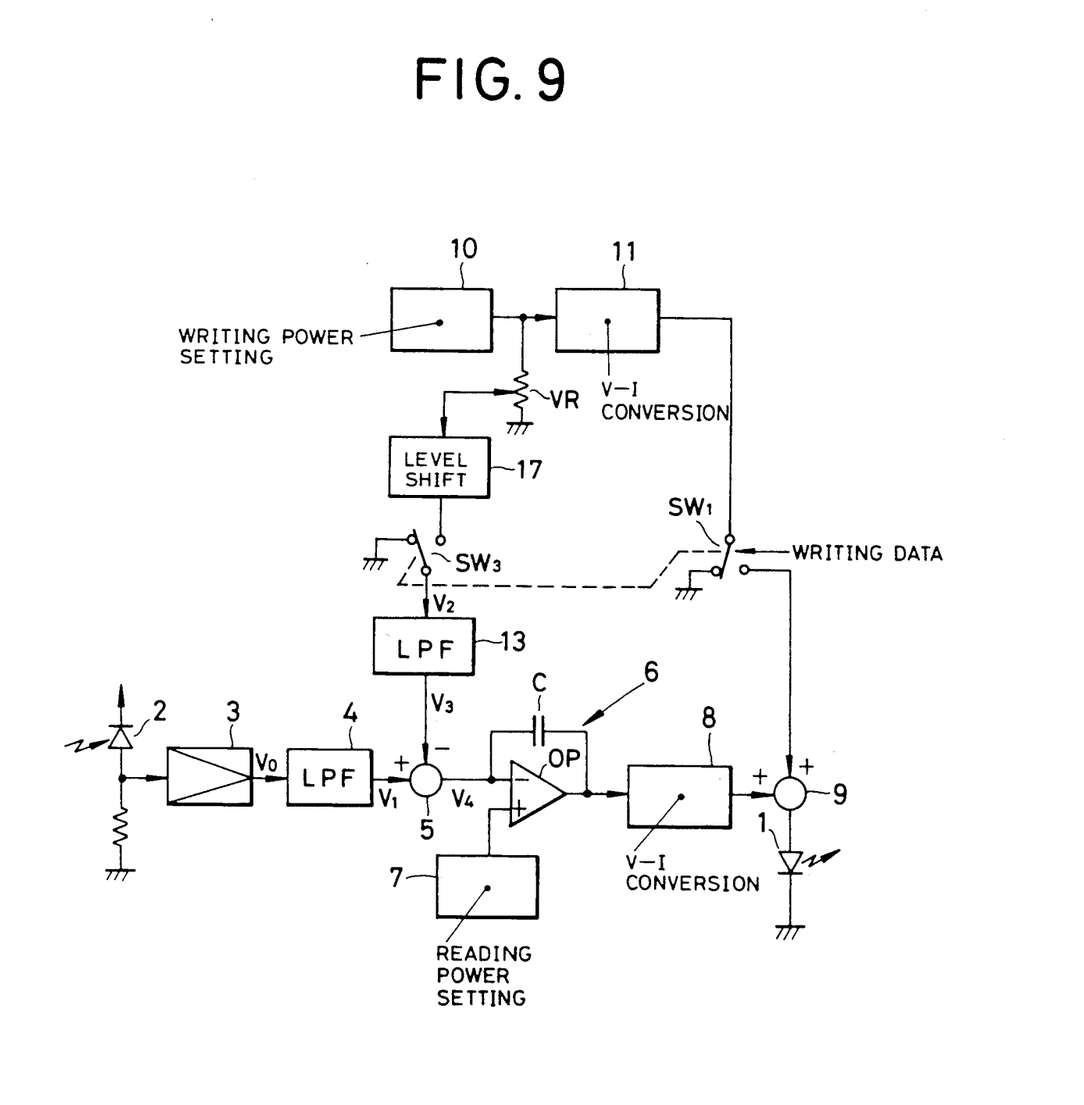
FIG. 9 is a block diagram showing a further embodiment of the present invention.

With respect to the structure shown in FIG. 9, the explanation of the circuit elements corresponding to those in the embodiment shown in FIG. 2 will not be repeated. As shown, only the output signals of the LPFs 4 and 13 are supplied to the adder-subtractor 5. On the other hand, only the signals from the switch SW$_1$ and the V-I converter 8 are supplied to the adding circuit 9 connected to the laser diode 1. Furthermore, in this embodiment, a level shift circuit 17 is inserted between the switch SW$_3$ and the variable resistor $V_R$. The level shift circuit 17 is provided to shift the input voltage level in a reducing direction by a predetermined level.

The operation of the circuit having the circuit construction shown in FIG. 9 will be explained with reference to the waveform diagram of FIG. 10.

Figure 10:
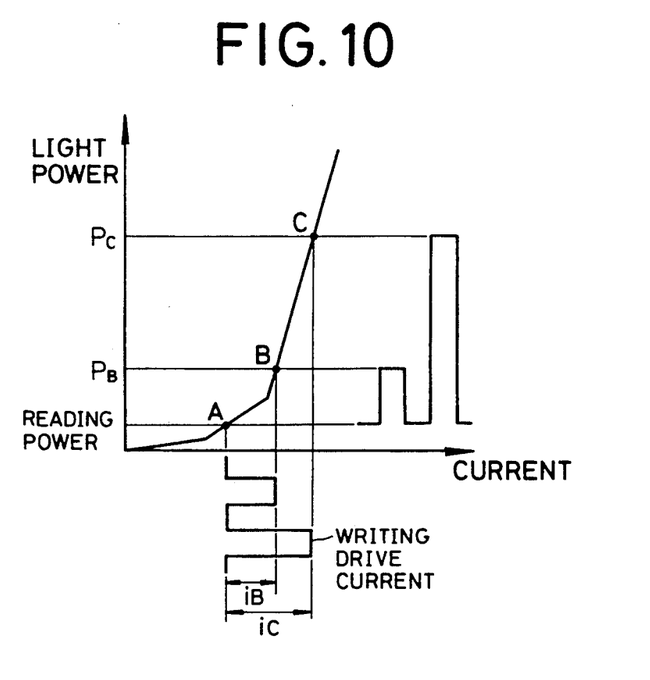
FIG. 10 is a diagram showing a current versus light power characteristic of the laser diode.
Figure 11:
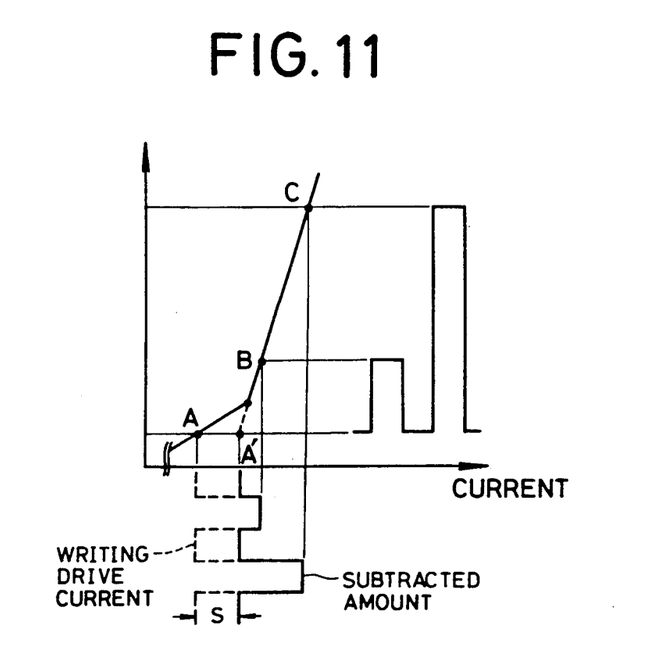
FIG. 11 is an enlarged diagram showing a major part of FIG. 10.

As shown in FIG. 10, the current-light power characteristic of the laser diode 1 is approximated by a polygonal line. It is assumed that the servo operation is steadily effected at a point A. By the application of the writing drive signal $i_C$, the light power increases to a level $P_C$. In order to change the peak power during the writing operation, it is sufficient to change the amount of increase of the writing drive current. For example, if a writing drive signal $i_B$ is added, a light power $P_B$ will be obtained. Since the point A is not on the extension of the line CB, a condition $i_B/i_C=P_B/P_C$ is not satisfied. Therefore, even if the average voltage $V_3$ proportional to the writing drive signal is subtracted from the average voltage $V_1$, the writing data component is not canceled completely and the data component will be mixed to the subtraction output signal of the adder-subtractor 5.

However, according to the present invention, the circuit is constructed that the voltage level corresponding to the writing power set value is level-shifted by the level shift circuit 17 by a predetermined level. Therefore by setting the above-mentioned predetermined level at an appropriate value, the writing data component can be completely canceled, to prevent the mixing of the writing data component into the subtraction output signal of the adder-subtractor 5. As a result, influences of the writing data on the operation of the control system is avoided even if the writing power is changed. Therefore the control of the light power can be performed in a stable manner also during the transition between the writing and reading modes.

In addition, the influence of the writing data component on the control system is originated from the fact that the point A in the characteristic curve shown in FIG. 10 is not on the extension of the line CB. Therefore, with respect to the voltage $V_3$ to be subtracted from the average voltage $V_1$, it is sufficient to set the origin on a virtual point A' on the extension of the line CB instead of the point A. Therefore, the predetermined level to be shifted by the level shift circuit 17 is to be set at a value S corresponding to the writing drive signal between the point A and the virtual point A'. In other words, in the voltage proportional to the writing drive current, a part above the predetermined level S is to be used as a subtraction part from the average voltage $V_1$. By this operation, the writing data component is completely canceled so that the mixing of the writing data component into the subtraction output of the adder-subtractor 5 is surely prevented.

As specifically described above, in the third embodiment of the light power control circuit for a semiconductor light-emitting element according to the present invention, the voltage corresponding to the writing power setting value is modulated by writing data, and an average of the voltage after the modulated i generated. The average voltage is subtracted from the average voltage of the light power detection voltage, and the increase-decrease control of the drive current of the semiconductor light-emitting element is performed in response to a variation component of the subtraction voltage with respect to the reading power set value (target value). Therefore, as the above-mentioned subtraction voltage, the same voltage is obtained both in the reading and writing modes. As a result, the change-over from the reading mode to the writing mode or vice versa can be performed immediately, and especially, the laser power can be returned to the reading power even if the laser diode is used to emit the writing power for a long time.

Furthermore, by the structure that the voltage corresponding to the reading power set value is shifted by a predetermined level and subsequently modulated by the writing data, influences of the writing data component on the control system are eliminated when writing power is changed. Therefore the control of the light power can be performed in a stable manner especially upon transition between the writing and reading modes.

What is claimed is:

1. A light power control circuit for controlling a light power of a semiconductor light-emitting element in an optical disk information recording and reproducing system, comprising:

drive current supply means for supplying a drive current to said semiconductor light-emitting element;

superposing means for superposing a high-frequency signal on said drive current, wherein said superposing means inhibits the superposition of said high-frequency signal during a writing mode of said recording and reproducing system, wherein said drive current supply means comprises:

light sensing device for receiving a part of light rays emitted by said semiconductor light-emitting element;

means for supplying a reading drive current corresponding to a reading power set value to said semiconductor light emitting element;

means for performing an increase-decrease control of said reading drive current in response to a variation of a detection output signal of said light sensing device with respect to said reading power set value;

correction means for correcting said detection output signal of said light sensing device during said writing mode;

first modulating means for modulating a voltage corresponding to a writing power set value by writing data; and means for superposing an output current of said first modulating means on said reading drive current and supplying a current obtained by the superposition to said semiconductor light-emitting element as a writing drive current.

2. The light power control circuit of claim 1, wherein said drive current supply means further comprises:

first averaging means for averaging said detection output signal of said light sensing device;

second modulating means for modulating said voltage corresponding to said writing power set value by said writing data;

second averaging means for averaging a modulation output signal of said second modulating means; and means for subtracting an output signal of said second averaging means from an output signal of said first averaging means.

3. The light power control circuit of claim 2, wherein said correction means further comprises:

third modulating means for modulating a predetermined correction voltage by said writing data;

third averaging means for averaging a modulation output signal of said third modulating means; and means for adding an output signal of said third averaging means on said output signal of said first averaging means.

4. A light power control circuit for a semiconductor light-emitting element, including a light sensing device for receiving a part of light rays emitted from the semiconductor light-emitting element and structured to control a light power of the semiconductor light-emitting element on the basis of a detection output signal of the light sensing device, said control circuit comprising:

control means for supplying a reading drive current corresponding to a reading power set value to said semiconductor light-emitting element;

means for performing an increase-decrease control of said reading drive current in response to a variation of a detection output signal of said light sensing device with respect to the reading power set value;

first modulating means for modulating a voltage corresponding to a writing power set value by writing data;

means for superposing an output current of said first modulating means on said reading drive current and supplying a superposed current to said semiconductor light-emitting element;

high frequency current superposing means for superposing a high frequency current on said reading drive current only during a reading mode; and correcting means for correcting said writing drive current during a writing mode.

5. The light power control circuit of claim 4, wherein said control means comprises:

first averaging means for averaging said detection output signal of said light sensing device;

second modulating means for modulating said voltage corresponding to said writing power set value by said writing data;

second averaging means for averaging a modulation output signal of said second modulating means; and subtracting means for subtracting an output signal of said second averaging means from an output signal of said first averaging means, wherein said control means performs the increase-decrease control of the reading drive current in response to a variation of an output signal of said subtracting means with respect to said reading power set value.

6. The light power control circuit of claim 4, further comprising means for correcting a detection output signal of said light sensing device during said writing mode.

7. A light power control circuit for a semiconductor light-emitting element including a light sensing device for sensing a part of light rays emitted from the semiconductor light-emitting element, and structured to control a light power of the semiconductor light-emitting element on the basis of a detection output signal of the light sensing device, the circuit comprising:

means for supplying a reading drive current signal corresponding to a reading power set value to said semiconductor light-emitting element;

first modulating means for modulating a current corresponding to a writing power set value by writing data;

means for superposing an output current of said first modulating means on said reading drive current and supplying a current obtained by the superposition to said semiconductor light-emitting element as a writing drive current;

first averaging means for averaging said detection output signal of the light sensing means;

level shifting means for shifting a signal level corresponding to said writing power set value by a predetermined level;

second modulating means for modulating an output signal of said level shifting means by said writing data;

second averaging means for averaging a modulation output signal of the second modulating means;

subtracting means for subtracting an output signal of the second averaging means from an output signal of the first averaging means; and means for performing an increasing and decreasing control of the reading drive current in response to a variation of an output subtraction signal of said subtracting means with respect to said reading power set value.

* * * * *